United States Patent [19]
Chung

[11] Patent Number: 5,908,303
[45] Date of Patent: Jun. 1, 1999

[54] MANUFACTURING METHOD OF LIGHT-EMITTING DIODE

[75] Inventor: Gil-yong Chung, Kyungki-do, Rep. of Korea

[73] Assignee: Samsung Display Devices Co., Ltd., Kyungki-do, Rep. of Korea

[21] Appl. No.: 08/777,121

[22] Filed: Dec. 30, 1996

[30] Foreign Application Priority Data

Dec. 30, 1995 [KR] Rep. of Korea ...................... 95-69765

[51] Int. Cl.$^6$ .......................... H01L 21/228; H01L 33/00
[52] U.S. Cl. .............................................. 438/45; 542/960
[58] Field of Search ................................ 438/22, 45, 542, 438/466, 960, 974, 782, FOR 330, FOR 301, FOR 416; 148/DIG. 3

[56] References Cited

FOREIGN PATENT DOCUMENTS 7-254729  10/1995  Japan .

*Primary Examiner*—John Niebling
*Assistant Examiner*—S. Mulpuri
*Attorney, Agent, or Firm*—Lowe Hauptman; Gopstein Gilman & Berner

[57] ABSTRACT

A manufacturing method of a light-emitting diode is provided. The light-emitting diode manufactured by the steps of coating solution containing p-type or n-type impurities on a porous silicon layer, thereby forming a p/n junction through a thermal treatment has excellent light-emitting efficiency. Also, the process is simple compared to an implantation method, and further the manufacturing is since the thermal treatment can be performed at a relatively low temperature.

12 Claims, 1 Drawing Sheet

MANUFACTURING METHOD OF LIGHT-EMITTING DIODE

BACKGROUND OF THE INVENTION

The present invention relates to a manufacturing method of a light-emitting diode, and more particularly, to a method for manufacturing a diode having excellent light-emitting efficiency at a relatively low temperature.

Currently, lightweight liquid crystal displays having low power consumption are widely in use, however, there are difficulties in obtaining large screen displays and colorization thereof. Due to these limitations in the liquid crystal display, interest in the light-emitting diode (LED) has increased.

In the light-emitting diode, visible rays are emitted when an electric field is applied to the diode, which is a phenomenon called electroluminescence (EL). In the case of a forward bias p/n junction, a hole and an electron are combined near the junction. Here, free electrons of high energy should be able to combine easily with the hole, with emitting energy. In all p/n junction diodes, a part of the energy is emitted in the form of heat or light. Here, the LED uses an emission property of visible light.

The diode essentially comprises a porous silicon layer and a contact layer, in which the material used for the contact layer is a metal, an indium tin oxide (ITO), silicon carbide or a conductive polymer.

Enhanced diodes have a structure in which a p/n junction is provided in the porous region. The porous silicon has the advantage of excellent quantum efficiency, which is defined as the ratio of emitted photons to applied electrons. Also, the light-emitting efficiency of the diode is considerably enhanced when impurities are implanted into the porous layer. For example, a p-type semiconductor is manufactured by doping a group III element such as boron, aluminum, gallium or indium, into the porous silicon in an appropriate ratio, and an n-type semiconductor is manufactured by doping impurities such as phosphorus, arsenic or antimony.

According to the conventional method, the diode having a p/n junction in a porous region is manufactured by forming a p/n junction using implantation or diffusion and then making the p/n junction porous by an appropriate process, or by making a silicon porous and then doping impurities on the porous layer to form a p/n junction.

However, when making the p/n junction porous, the p/n junction is transformed to deteriorate the light-emitting efficiency of the diode. Meanwhile, in the case that impurities are doped into the porous layer, a diffusion or implantation method is used. Here, the diffusion method requires a heat treatment at 900° C. or higher, and the implantation method includes a complicated two-step process.

SUMMARY OF THE INVENTION

Accordingly, it is an object of the present invention to provide a manufacturing method of a light-emitting diode having excellent light-emitting efficiency.

To accomplish the above object of the present invention, there is provided a manufacturing method of a light-emitting diode comprising the steps of: a) making one side of a p-type silicon substrate porous; b) doping n-type impurities in the porous side of the silicon layer to form a p/n junction; and c) forming a contact layer on the porous silicon layer, wherein the doping of n-type impurities is performed by coating a solution containing group V element ions on the porous silicon layer; and then thermally treating the coated porous silicon layer.

To accomplish the above object of the present invention, there is also provided a manufacturing method of a light-emitting diode comprising the steps of: a) making one side of a n-type silicon substrate porous; b) doping p-type impurities in the porous side of the silicon layer to form a p/n junction; and c) forming a contact layer on the porous silicon layer, wherein the doping of p-type impurities is performed by coating a solution containing group III element ions on the porous silicon layer, and then thermally treating the coated porous silicon layer.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1A:
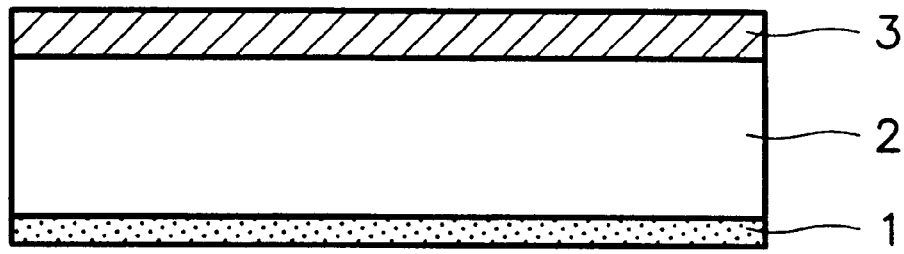
FIGS. 1A through 1C are sectional views illustrating the manufacturing process of a light-emitting diode according to an embodiment of the present invention.

Referring to FIG. 1A, a contact layer 1 is formed on the one side of a p-type or n-type silicon substrate. Then, the other side of the silicon substrate is emersed into a hydrofluoric acid solution to be made porous. Therefore, silicon substrate is transformed into a two layered structure of a bulk silicon layer 2 and a porous silicon layer 3. In order to provide the diode with excellent light-emitting properties, the size of the pore should be several nanometers in diameter. Accordingly, during a process of forming a porous silicon layer from the silicon substrate, ultraviolet light must be irradiated.

Figure 1B:
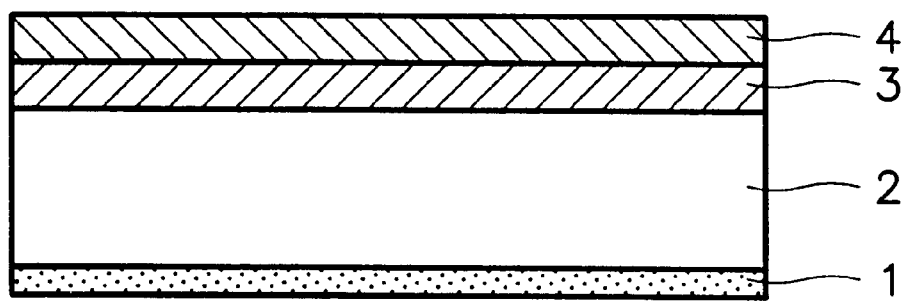

In FIG. 1B, the porous silicon layer is coated with a solution containing impurities and thermally treated, form a porous layer 4 doped with impurities. Here, the solution containing impurities is selected depending on whether the silicon substrate is n-type or p-type. In the case of a n-type silicon substrate, a solution containing group III element ions is used, and in the case of a p-type silicon substrate, a solution containing group V element ions is used. Also, the heat treatment is preferably performed at 300~600° C. and more preferably, at 500~600° C. Heating times are preferably 3–24 hours.

According to the present invention, the group III element ion solution is made by dissolving boron, aluminum, gallium or indium in acid or base. For example, aluminum, gallium or indium can be dissolved in a nitric acid solution, and boron can be dissolved in hydrogen peroxide or an ammonium hydroxide solution. Also, it is preferable that the concentration of the acid or base is 1~10 wt %.

For the group V element ion solution, an acidic solution in which phosphorus or antimony is dissolved can be used. For example, phosphorus can be dissolved in a nitric acid solution, and antimony can be dissolved in a hydrochloric acid solution. It is preferable that the concentration of the acid is 1~10 wt %.

Figure 1C:
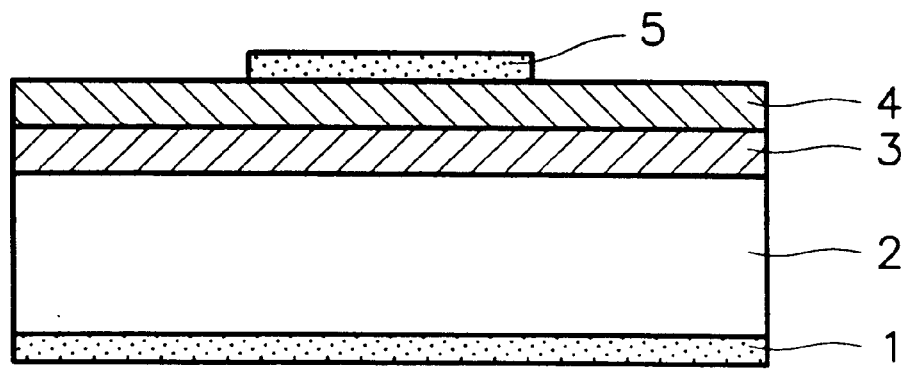

In FIG. 1C, when the p/n junction is formed, a contact layer is formed on the porous layer 4 by a conventional method, to thereby complete the light-emitting diode. For the contact layer, a metal such as gold or aluminum, ITO, silicon carbide or conductive polymer having properties of transparency, conductivity and surface stability, which are required for material of the contact layer, can be used.

As described above, according to the present invention, the p/n junction is formed on a porous silicon, to thereby form a light-emitting diode having excellent light-emitting efficiency without transformation of the p/n junction. Also, the process is simple in comparison with the implantation method, and further the light-emitting diode can be manufactured easily since a thermal treatment can be performed at a relatively low temperature.

What is claimed is:

1. A manufacturing method of a light-emitting diode comprising the steps of:

a) making one side of a p-type silicon substrate porous;

b) doping n-type impurities in the porous side of said silicon layer, to form a p/n junction; and c) forming a contact layer on said porous silicon layer, wherein said step b) of doping n-type impurities is performed by coating a solution containing group V element ions on said porous silicon layer, and then thermally treating said coated porous silicon layer.

2. A manufacturing method of a light-emitting diode according to claim 1, wherein said contact layer is formed of one selected from the group consisting of gold, aluminum, ITO, silicon carbide and conductive polymer.

3. A manufacturing method of a light-emitting diode according to claim 1, wherein said solution containing group V element ions is a nitric acid solution in which phosphorus is dissolved.

4. A manufacturing method of a light-emitting diode according to claim 1, wherein said solution containing group V element ions is a hydrochloric acid solution in which antimony is dissolved.

5. A manufacturing method of a light-emitting diode according to claim 1, wherein said thermal treatment is performed at 300~600° C.

6. A manufacturing method of a light-emitting diode according to claim 5, wherein said thermal treatment is performed at 500~600° C.

7. A manufacturing method of a light-emitting diode comprising the steps of:

a) making one side of a n-type silicon substrate porous;

b) doping p-type impurities in the porous side of said silicon layer, to form a p/n junction; and c) forming a contact layer on said porous silicon layer, wherein said step b) of doping p-type impurities is performed by coating a solution containing group III element ions on said porous silicon layer, and then thermally treating said coated porous silicon layer.

8. A manufacturing method of a light-emitting diode according to claim 7, wherein said contact layer is formed of one selected from the group consisting of gold, aluminum, ITO, silicon carbide and conductive polymer.

9. A manufacturing method of a light-emitting diode according to claim 7, wherein said solution containing group III element ions is a nitric acid solution in which one selected from the group consisting of aluminum, gallium and indium is dissolved.

10. A manufacturing method of a light-emitting diode according to claim 7, wherein said solution containing group III element ions is hydrogen peroxide or ammonium hydroxide in which boron is dissolved.

11. A manufacturing method of a light-emitting diode according to claim 6, wherein said thermal treatment in said step c) is performed at 300~600° C.

12. A manufacturing method of a light-emitting diode according to claim 11, wherein said thermal treatment in said step c) is performed at 500~600° C.

* * * * *